United States Patent [19]
Berman et al.

[11] Patent Number: 4,783,363
[45] Date of Patent: * Nov. 8, 1988

[54] CURABLE COMPOSITIONS CONTAINING A POLYEPOXIDE AND A HALOGENATED BISPHENOL

[75] Inventors: Jody R. Berman, Lake Jackson, Tex.; Abel Mendoza, Midland, Mich.

[73] Assignee: The Dow Chemical Company, Midland, Mich.

[*] Notice: The portion of the term of this patent subsequent to Aug. 2, 2003 has been disclaimed.

[21] Appl. No.: 24,651

[22] Filed: Mar. 11, 1987

Related U.S. Application Data

[63] Continuation-in-part of Ser. No. 911,267, Sep. 24, 1986, abandoned, which is a continuation-in-part of Ser. No. 832,428, Feb. 24, 1986, abandoned.

[51] Int. Cl.$^4$ .................. B05D 3/00; C08G 65/08
[52] U.S. Cl. .................................. 428/285; 428/273; 523/400; 525/482; 525/505; 525/507; 525/523; 528/90; 528/98; 528/99; 528/102
[58] Field of Search ............ 428/273, 285; 523/400; 525/482, 505, 507, 523; 528/90, 98, 99, 102

[56] References Cited

U.S. PATENT DOCUMENTS 3,723,335 3/1973 Tanaka et al. .................. 252/182
4,604,317 8/1986 Berman et al. .................. 428/285

OTHER PUBLICATIONS

Application Ser. No. 851,996 filed Apr. 4, 1986.

Primary Examiner—John Kight
Assistant Examiner—Kriellion Morgan

[57] ABSTRACT

An improvement in curable compositions which comprise a polyglycidyl ether such as the triglycidylether of tris(hydroxyphenyl)methane and a halogenated dihydric phenol such as tetrabromobisphenol A, the improvement being employing as the halogenated dihydric phenol one in which the halogen atoms are meta with respect to the hydroxyl groups such as 2,2′,6,6′-tetrabromo-3,3′,5,5′-tetramethyl-4,4′-biphenol. These compositions can be cured by heating in the presence or absence of a catalyst for reacting epoxy groups with phenolic hydroxyl groups such as 2-methyl imidazole. These compositions are particularly useful in the preparation of electrical laminates.

39 Claims, No Drawings

1

CURABLE COMPOSITIONS CONTAINING A POLYEPOXIDE AND A HALOGENATED BISPHENOL

CROSS REFERENCE TO RELATED APPLICATION

This application is a continuation-in-part of application Ser. No. 911,267, filed Sept. 24, 1986, now abandoned which is a continuation-in-part of application Ser. No. 832,428, filed Feb. 24, 1986, now abandoned.

FIELD OF THE INVENTION

The present invention pertains to curable compositions containing polyglycidyl ethers of a polyphenol and halogenated bisphenols.

BACKGROUND OF THE INVENTION

Compositions containing glycidyl ethers of bisphenols and halogenated bisphenols have been employed in the preparation of electrical laminates. However, they are usually lacking in one or more properties such as thermal performance, moisture resistance and high temprature mechanical strength and the like.

U.S. Pat. No. 4,604,317 issued Aug. 5, 1986 to J. R. Berman, C. C. Berkfelt and D. J. Aldrich provides curable compositions which result in cured compositions having an improvement in one or more of the properties selected from thermal stability, glass transition temperature, elevated temperature mechanical strength, moisture resistance, chemical resistance and toughness and the like.

SUMMARY OF THE INVENTION

The present invention pertains to an improvement in a composition comprising
(A) at least one of
  (1) at least one epoxy resin represented by formulas I, II, III, IV, V or VI

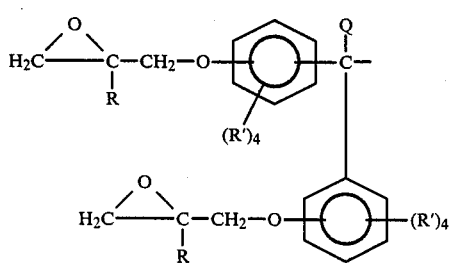

FORMULA I

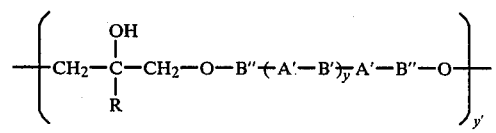

FORMULA II

B$(-$A$'-$B$'$$)_{\overline{y}}$A$'-$B$''-$O$-$

FORMULA III

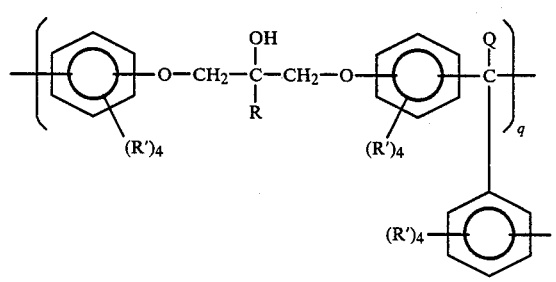

FORMULA IV

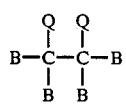

FORMULA V

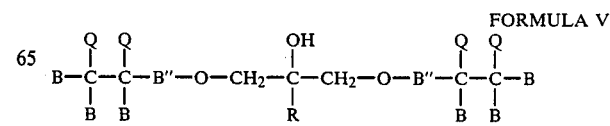

-continued

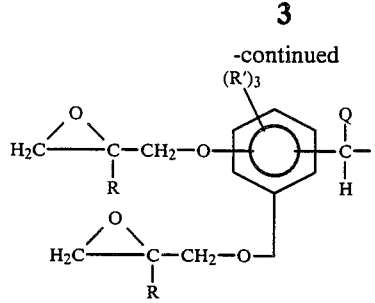
FORMULA VI wherein each A' is independently a divalent hydrocarbyl group having from 1 to about 12 carbon atoms, —S—, —S—S—, —SO—, —SO₂—, —CO— or —O—; each B is represented by the formula

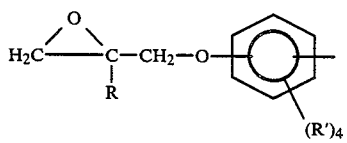

each B' is represented by the formula

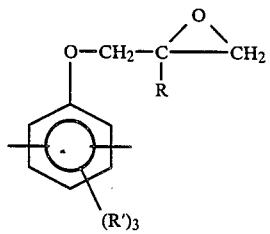

each B" is represented by the formula

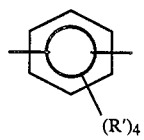

each R is independently hydrogen or an alkyl group having from 1 to about 4 carbon atoms; each Q is independently hydrogen or a hydrocarbyl group having from 1 to about 10 carbon atoms; each R' is independently hydrogen, a hydrocarbyl or hydrocarbyloxy group having from 1 to about 10 carbon atoms or a halogen; m has a value of n−1; m' has a value of n'−1; m" has a value of n"−1; each n, n' and n" independently has a value from zero to about 3; q has a value from zero to about 4; each y independently has an average value from 1 to about 5; y' has an average value of from zero to about 3 and each z and z' independently has a value from zero to about 3;

(2) the reaction product of
(a) at least one epoxy resin represented by formula (I) as defined in component (A-1); and
(b) at least one dihydric or polyhydric phenol represented by the following formulas VII, VIII or IX

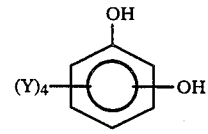
FORMULA VII

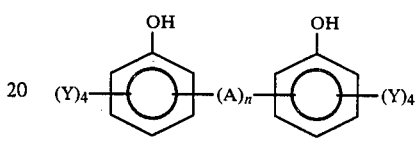
FORMULA VIII

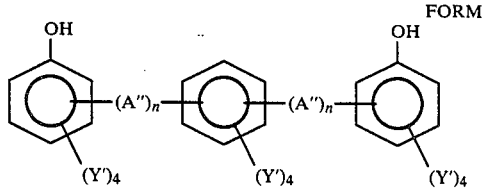
FORMULA (IX)

wherein A is a divalent hydrocarbon group having from 1 to about 12 carbon atoms, —O—, —S—, —S—S—, —SO—, —SO₂—, or —CO—: each A" is independently a divalent hydrocarbon group having from 1 to about 6 carbon atoms, each Y is independently hydrogen, a halogen or a hydrocarbyl or hydrocarbyloxy group having from 1 to about 10 carbon atoms; each Y' is independently hydrogen, a hydrocarbyl or hydrocarbyloxy group having from 1 to about 10, preferably from 1 to about 4, carbon atoms, a halogen atom or a hydroxyl group; and n has a value of zero or 1; and wherein components (A-2a) and (A-2-b) are present in quantities such that the ratio of phenolic hydroxyl groups to epoxide groups is from about 0.01:1 to about 0.5:1, preferably from about 0.05:1 to about 0.25:1, most preferably from about 0.1:1 to about 0.2:1; or (3) mixtures thereof; and (B) at least one halogenated dihydric or polyhydric phenol represented by formulas X, XI or XII

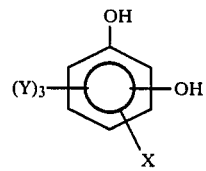
FORMULA X

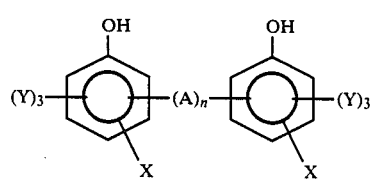
FORMULA XI

-continued

FORMULA XII

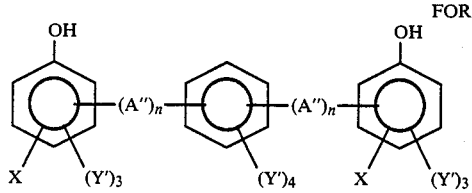

wherein A is a divalent hydrocarbyl group having from 1 to about 12, preferably from 1 to about 6 carbon atoms, —S—, —S—S—, —SO—, —SO$_2$—, —CO—, or —O—; each X is a halogen, preferably bromine; each A" is independently a divalent hydrocarbon group having from 1 to about 6 carbon atoms; each X is a halogen, preferably bromine; each Y is independently hydrogen, a halogen or a hydrocarbyl or hydrocarbyloxy group having from 1 to about 10 carbon atoms; each Y' independently is hydrogen, a hydrocarbyl or hydrocarbyloxy group having from 1 to about 10, preferably from 1 to about 4 carbon atoms, a halogen atom or a hydroxyl group; and n has a value of zero or 1; and with the proviso that at least one X or Y in formula XI and at least one X or Y' in formula XII is a halogen
wherein components (A) and (B) are present in quantities such that the ratio of phenolic hydroxyl groups to epoxide groups is from about 0.7:1 to about 1:1.1, preferably from about 0.85:1 to about 1:1, most preferably from about 0.9:1 to about 0.95:1; and
wherein the improvement resides in employing as at least a portion of component (B), a halogenated dihydric phenol wherein at least 5, preferably at least about 30, most preferably at least about 50 percent of the halogen atoms present in component B are in the meta position with respect to the hydroxyl groups.

Another aspect of the present invention pertains to an improvement in a composition comprising
(A) at least one of
(1) at least one epoxy resin represented by formulas I, II, III, IV, V or VI wherein each A' is independently a divalent hydrocarbyl group having from 1 to about 12 carbon atoms, —S—, —S—S—, —SO—, —SO$_2$—, —CO— or —O—; each B is represented by the formula

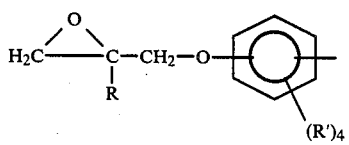

each B' is represented by the formula

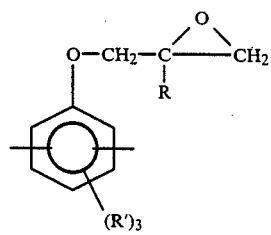

each B" is represented by the formula

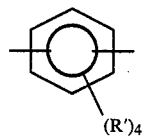

each R is independently hydrogen or an alkyl group having from 1 to about 4 carbon atoms; each Q is independently hydrogen or a hydrocarbyl group having from 1 to about 10 carbon atoms; each R' is independently hydrogen, a hydrocarbyl or hydrocarbyloxy group having from 1 to about 10 carbon atoms or a halogen; m has a value of n−1; m' has a value of n'−1; m" has a value of n"−1; each n, n' and n" independently has a value from zero to about 3; q has a value from zero to about 4; each y independently has an average value from 1 to about 5; y' has an average value of from zero to about 3 and each z and z' independently has a value from zero to about 3;
(2) the reaction product of
(a) at least one epoxy resin represented by formulas I, II, III, IV, V or VI and
(b) at least one dihydric or polyhydric phenol represented by the formulas VII, VIII or IX wherein A is a divalent hydrocarbon group having from 1 to about 12 carbon atoms, -S-, —S—S—, —SO—, —SO$_2$—, —CO— or —O—; each A" is independently a divalent hydrocarbon group having from 1 to about 6 carbon atoms; each A" is independently a divalent hydrocarbon group having from 1 to about 6 carbon atoms; each Y is independently hydrogen, a halogen or a hydrocarbyl or hydrocarbyloxy group having from 1 to about 10 carbon atoms; each Y' is independently hydrogen, a hydrocarbyl or hydrocarbyloxy group having from 1 to about 10, preferably from 1 to about 4 carbon atoms, a halogen atom or a hydroxyl group; and n has a value of zero or 1; and wherein components (A-2-a) and (A-2-b) are present in quantities such that the ratio of phenolic hydroxyl groups to epoxide groups is from about 0.01:1 to about 0.5:1, preferably from about 0.05:1 to about 0.25:1, most preferably from about 0.1:1 to about 0.2:1; or
(3) mixtures thereof;
(B) at least one halogenated dihydric or polyhydric phenol represented by formulas X, XI or XII wherein A is a divalent hydrocarbon group having from 1 to about 12 carbon atoms, —S—, —S—S—, —SO—, —SO$_2$—, —CO— or —O—; each X is a halogen, preferably bromine; each A" is independently a divalent hydrocarbon group having from 1 to about 6 carbon atoms; each Y is independently hydrogen, a halogen or a hydrocarbyl or hydrocarbyloxy group having from 1 to about 10 carbon atoms; each Y' is independently hydrogen, a hydrocarbyl or hydrocarbyloxy group having from 1 to about 10, preferably from 1 to about 4 carbon atoms, a halogen atom or a hydroxyl group; and n has a value of zero or 1; and with the proviso that at least one X or Y in formula XI and at least one X or Y' in formula XII is a halogen;

(C) an effective quantity of at least one catalyst for effecting the reaction between components (A) and (B); and (D) from zero to about 50, preferably from about 10 to about 45, most preferably from about 30 to about 40, percent by weight of the combined weight of components (A), (B), (C) and (D) of at least one solvent; and wherein components (A) and (B) are present in quantities such that the ratio of phenolic hydroxyl groups to epoxide groups is from about 0.7:1 to about 1.1:1, preferably from about 0.85:1 to about 1:1, most preferably from about 0.9:1 to about 0.95:1;

wherein the improvement resides in employing as at least a portion of component B, a halogenated dihydric phenol wherein at least 5, preferably at least about 30, most preferably at least about 50 percent of the halogen atoms present in component B are in the meta position with respect to the hydroxyl groups.

The present invention also pertains to substrates impregnated with the aforementioned compositions and to laminates prepared therefrom.

The present invention provides curable compositions which result in cured compositions having an improvement in one or more of the properties selected from glass transition temperature, resistance to decomposition, moisture resistance, toughness and elevated temperature mechanical strength, and the like.

DETAILED DESCRIPTION OF THE PRESENT INVENTION

Particularly suitable epoxy resins which can be employed herein include, for example, the triglycidyl ether of tris(hydroxyphenyl)methane, higher molecular weight homologs thereof, trisepoxides advanced with dihydric phenols, phenol-formaldehyde epoxy novolac resins, cresol-formaldehyde epoxy novolac resins, resorcinol-formaldehyde epoxy novolac resins, phenolglyoxal epoxy novolac resins, mixtures thereof and the like.

Also suitable as an epoxy resin which can be employed herein are those glycidyl ethers of phenolaldehyde novolac resins wherein at least a portion of the two functional material has been removed. These epoxy resins are disclosed by Bertram et al in an allowed copending application Ser. No. 818,513 filed Jan. 13, 1986 which is incorporated herein by reference.

Particularly suitable dihydric phenols and halogenated dihydric phenols include, for example, bisphenol A, tetrabromobisphenol A, bisphenol S, tetrabromobisphenol S, biphenol, tetrabromobiphenol, tetrabromodihydroxybenzophenone, resorcinol, tetrabromoresorcinol, mixtures thereof and the like.

Multifunctional phenolic compounds, those having an average functionality of greater than 2, can be employed in this invention together with the diphenolic compounds, if desired, so as to change the cure behavior of the composition. Particularly suitable multifunctional phenolic compounds include, for example, phenol-formaldehyde condensation products having an average functionality of from about 3 to about 8, phenol-hydroxybenzaldehyde condensation products having an average functionality from of about 3 to about 7 and cresol-formaldehyde condensation products having an average functionality of from about 3 to about 8.

Suitable halogenated dihydric phenols and polyhydric phenols having the halogen atoms in the meta position with respect to the hydroxyl groups which can be employed herein include, for example, those represented by the following formulas XIII and XIV

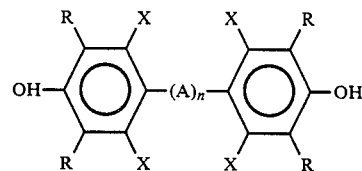

FORMULA XIII

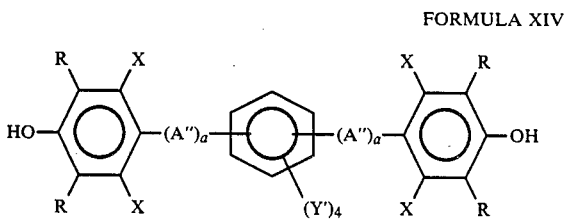

FORMULA XIV wherein A is a divalent hydrocarbyl group having from 1 to about 12, preferably from 1 to about 6 carbon atoms, —S—, —S—S—, —SO—, —SO$_2$—, —CO— or —O—; each A″ is independently a divalent hydrocarbon group having from about 1 to about 6 carbon atoms; each R is independently hydrogen or a hydrocarbyl or hydrocarbyloxy group having from 1 to about 10, from 1 to about 4 carbon atoms; each X is independently hydrogen, a hydrocarbyl or hydrocarbyloxy group having from 1 to about 10, preferably from 1 to about 4 carbon atoms or a halogen atom, preferably chlorine or bromine, most preferably bromine, with the proviso that at least one of the X groups is a halogen atom; each Y′ independently is hydrogen, a hydrocarbyl or hydrocarbyloxy group having from 1 to about 10, preferably from 1 to about 4 carbon atoms, a halogen atom or a hydroxyl group; and n has a value of zero or 1.

Particularly suitable halogenated dihydric phenols having at least one halogen atom in the meta position with respect to the hydroxyl group include, for example, 2,2′,6,6′-tetrabromo-3,3′, 5,5′-tetramethyl-4,4′-biphenol, 2,2′6-tribromo-3,3′, 5,′-tetramethyl-4,4′-biphenol, 2,2-bis-(2,6-dibromo-3,5-dimethylhydroxyphenyl)ethane, 2,2-bis-(2,6-dibromo-3,5-dimethylhydroxyphenyl)methane, combinations thereof and the like.

The halogenated dihydric phenols wherein the halogen atoms are meta with respect to the hydroxyl groups and which also have hydrocarbyl or hydrocarbyloxy groups attached to the ring can be prepared by oxidative coupling of 2,6-dimethylphenol using palladium over carbon catalyst at 80° C. in the presence of oxygen gas. This product is then treated with hydrogen gas and palladium over carbon catalyst to make 3,3′, 5,5′-tetramethyl-4,4′-biphenol. This product is then reacted with bromine to yield 2,2′,6,6′-tetrabromo-3,3′,5,5′-tetramethyl-4,4′-biphenol.

Those halogenated dihydric phenols wherein the halogen atoms are meta with respect to the hydroxyl groups and which do not have hydrocarbyl or hydrocarbyloxy groups attached to the ring can be prepared by dealkylation of 2,2′-dibromo-3,3′,5,5′-tetra-t-butyl-4,4′-biphenol to form 2,2′-dibromo-4,4′-biphenol.

Suitable catalysts for effecting the reaction between the epoxy resin and the phenolic hydroxyl-containing compound include, for example, those disclosed in U.S. Pat. Nos. 3,306,872; 3,341,580; 3,379,684; 3,477,990; 3,547,881; 3,637,590; 3,843,605; 3,948,855; 3,956,237;

4,048,141; 4,093,650; 4,131,633; 4,132,706; 4,171,420; 4,177,216; 4,302,574; 4,320,222; 4,358,578; 4,366,295; and 4,389,520, all of which are incorporated herein by reference.

Particularly suitable catalysts are those quaternary phosphonium and ammonium compounds such as, for example, ethyltriphenylphosphonium chloride, ethyltriphenylphosphonium bromide, ethyltriphenylphosphonium iodide, ethyltriphenylphosphoniumacetate, ethyltriphenylphosphonium diacetate (ethyltriphenylphosphonium acetate.acetic acid complex), ethyltriphenylphosphonium tetrahaloborate, tetrabutylphosphonium chloride, tetrabutylphosphonium acetate, tetrabutylphosphonium diacetate (tetrabutylphosphonimm acetate.acetic acid complex), tetrabutylphosphonium tetrahaloborate, butyltriphenylphosphonium tetrabromobisphenate, butyltriphenylphosphonium bisphenate, butyltriphenylphosphonium bicarbonate,benzyltrimethylammonium chloride, benzyltrimethylammonium hydroxide, benzyltrimethylammonium tetrahaloborate, tetramethylammonium hydroxide, tetrabutylammonium hydroxide, tetrabutylammonium tetrahaloborate, and mixtures thereof and the like.

Other suitable catalysts include tertiary amines such as, for example, triethylamine, tripropylamine, tributylamine, 2-methylimidazole, benzyldimethylamine, mixtures thereof and the like.

Other suitable catalysts include ammonium compounds such as, for example, triethylammonium chloride, triethylammonium bromide, triethylammonium iodide, triethylammonium tetrahaloborate, tributylammonium chloride, tributylammonium bromide, tributylammonium iodide, tributylammonium tetrahaloborate, N,N'-dimethyl-1,2-diaminoethane-tetrahaloboric acid complex, and mixtures thereof and the like.

Other suitable catalysts include quaternary and tertiary ammonium, phosphonium, and arsonium adducts or complexes with suitable non-nucleophilic acids such as, for example, fluoboric, fluoarsenic, fluoantimonic, fluophosphoric, perchloric, perbromic, periodic, mixtures thereof and the like.

The catalysts are suitably employed in any quantity which is sufficient to cause curing of the epoxy resin and the phenolic hydroxyl-containing composition at the temperture employed. Particularly suitable quantities for the catalyst is from about 0.5 to about 5, more suitably from about 0.1 to about 2, most suitably from about 0.2 to about 1, parts of catalyst per 100 parts by weight of epoxy resin contained in the composition.

Suitable solvents which can be employed herein include, for example, ketones, alcohols, glycol ethers and amides, such as, for example, acetone, methyl ethyl ketone, methanol, propylene glycol mono methyl ether and dimethyl formamide.

The compositions of the present invention may also contain, if desired, stabilizers, pigments, dyes, mold release agents, flow control agents, reinforcing agents, fillers, fire retardant agents, rubber modifiers, surfactants, accelerators, reactive diluents, mixtures thereof and the like.

Suitable stabilizers which can be employed herein include, for example, those represented by the formula

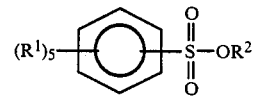

FORMULA XV.

wherein each $R^1$ is independently hydrogen, a hydrocarbyl group having from 1 to about 10 carbon atoms or a halogen and $R^2$ is a hydrocarbyl group having from 1 to about 10 carbon atoms.

Particularly suitable stabilizers include, for example, methyl p-toluene sulfonate, ethyl p-toluene sulfonate, methyl chlorobenzene sulfonate, combinations thereof and the like.

The stabilizer component, when used, can be employed in any suitable quantity; however, the usual quantity is from about 0.001 to about 10, suitably from about 0.01 to about 2 percent by weight based upon the weight of the epoxy resin component.

The compositions of the present invention are suitable for such applications as structural or electrical laminates or composites, coatings, adhesives, castings, moldings, electronic encapsulations and in potting compositions. Suitable substrates which can be employed herein include, for example, fibers or filaments in woven, matt or non-woven form of glass, carbon, graphite, synthetic fibers, quartz, combinations thereof and the like.

Electrical laminates are usually prepared from one or more plies of a substrate material impregnated with a curable resin composition with an outer ply of an electrical conducting material.

Suitable electrical conducting materials include, for example, aluminum, copper, gold, platinum and silver.

The following examples are illustrative of the invention but are not to be construed as to limiting the scope thereof in any manner.

Fracture Toughness Measurement ($G_{1C}$)

The method for measuring $G_{1C}$ (fracture toughness or "critical strain energy release rate") is an adaptation of ASTM E-399 for plastics materials from the original usage with metals. The compact tension test is now widespread in usage and is described in the J. Mater. Sci., Vol. 16, 2657, 1981. An individual test piece is cut as an approximate 1" (25.4 mm) square from a flat casting usually of ⅛" (3.175 mm) thickness. A dovetail notch is cut into one edge, centered, about ¼" (6.25 mm) in depth. Next, a razor blade is inserted into this notch and tapped to produce a precrack. Two holes are then drilled adjacent to the dovetail as indicated in ASTM E-399, allowing the test piece to be pinned into position in the Instron test machine. Extension of the sample now allows the force required to propagate opening of the precrack to be measured, using a test speed of 0.02 inches/minute (0.0085 mm/sec.). This force is used in the equation given in ASTM E-399, along with the required sample dimensions and actual precrack length, to calculate a þstress intensification factor" $K_Q$. This is then combined with the tensile modulus and Poisson's ratio for the material to give the value for $G_{1C}$, usually reported in ergs/cm x 106. A scale comparing typical values for $G_{1C}$ for various plastics and metals is given in reference Lee, L. H., "Physicochemical Aspects of Polymer Surfaces", K. L. Mittal, ed. Plenum Press, New York, N.Y., 1983.

The Tg was determined by Differential Scanning Calorimetry using a calibrated DuPont Instrument (Model No. 912 with a 1090 controller). Samples were run under a nitrogen atmosphere with a heat-up rate of 10° C. per min. (0.1667° C./sec.).

Coefficient of thermal expansion (CTE) was determined using a calibrated DuPont Thermal Mechanical Analyzer (Model No. 943 with a 1090 controller).

Decomposition properties were determined using a DuPont Thermal Gravimetric Analyzer (Model No. 951 with a DuPont 1090 controller).

Dynamic mechanical properties were measured on a DuPont Dynamic Mechanical Analyzer (Model No. 982 with a DuPont 1090 controller).

The following components were employed in the Examples and Comparative Experiments.

Epoxy Resin A was a polyglycidyl ether of a phenol-orthohydroxybenzaldehyde condensation product having an EEW of 220 and an average functionality of about 3.6.

Epoxy Resin B was the reaction product of a diglycidyl ether of bisphenol A having an EEW of 180 and tetrabromobisphenol A wherein the bromine atoms were in the ortho position with respect to the hydroxyl groups. The resultant epoxy resin had an EEW of 430.

Epoxy Resin C was a phenol-formaldehyde epoxy novolac resin having an average functionality of 3.6 and an average EEW of 178.

Epoxy Resin D was a cresol-formaldehyde epoxy novolac resin having an average functionality of 6 and an average EEW of 211. The epoxy resin melt viscosity at 150° C. was 880 cs.

Epoxy Resin E was a phenol-formaldehyde epoxy novolac resin having an average functionality of 6, containing less then 1 percent two functional monomer and having an average EEW of 185 (the epoxy was made from a water extracted 91° C. melt point novolac).

Epoxy Resin F was a polyglycidyl ether of a phenol/glyoxal condensation product having an average functionality of 4.2 and an average EEW of 231.

Epoxy Resin G was a polyglycidyl ether of a phenol-orthohydroxybenzaldehyde condensation product having an EEW of 204 and an average functionality of 3.5.

Dihydric Phenol A was 2,2',6,6'-tetrabromo-3,3',5,5'-tetramethyl-4,4'-biphenol.

Dihydric Phenol B was 4,4'-isopropylidene-bis-2,6-dibromophenol, also known as tetrabromobisphenol A.

EXAMPLE 1

50 g (0.2273 epoxy equiv.) of Epoxy Resin A was heated to 175° C. and degassed. Into the molten resin was stirred 63 g (0.2260 hydroxyl equiv.) of Dihydric Phenol A while maintaining the temperature above 160° C. After 10 minutes (600 s), the halogenated phenolic material had dissolved into the resin. The resin system was then degassed and 0.1 g of 2-ethyl, 4-methyl imidazole was stirred into the mixture. The mixture was then poured into an aluminum mold, which had been sprayed with fluoroglide to prevent sticking, so as to produce cured castings having a thickness of $\frac{1}{8}$" (3.175 mm). The mold was placed into an oven for 1 hour (3600 s) at 180° C. and 2 hours (7200 s) at 230° C. The results are given in Table 1.

COMPARATIVE EXPERIMENT A 56.87 g (0.209 hydroxyl equiv.) of Dihydric Phenol B in which all of the bromine atoms were in the ortho position with respect to the hydroxyl groups was stirred into 50 g (0.238 epoxy equiv.) of Epoxy Resin A at 175° C. After heating for 10 minutes (600 s), the resin solution was degassed and 0.1 g of 2-ethyl, 4-methyl imidazole was stirred into the mixture. The resin was then poured into an aluminum mold and cured as in Example 1. The results are given in Table 1.

COMPARATIVE EXPERIMENT B 50 g (0.116 hydroxyl equiv.) of Epoxy Resin B was heated to 150° C. 5.74 g of methylene dianiline (49.5 amine hydrogen equiv.) was stirred into an aluminum mold as in Exmple 1 and cured in an oven at 175° C. for 2 hours (7200 s). The results are given in Table I.

TABLE I

| Example or Comparative Experiment | Tg °C. | Dynamic Decomposition Temperature |
|---|---|---|
| Ex. 1 | 220 | 365 |
| Comp. Expt. A | 190 | 315 |
| Comp. Expt. B | 160 | 310 |

EXAMPLE 2

A. Varnish Formulation 1434 g (4.889 equiv.) of a 75% solution of Epoxy Resin A in methyl ethyl ketone 2339 g (4.614 equiv.) of a 55% solution of Dihydric Phenol A in methanol 7.532 g of a 5% solution of 2-methylimidazole in dimethylformamide 200 g of acetone The varnish formulation had a viscosity of 19 seconds measured in a No. 2 Zahn cup at 75° F. The formulation also had a gel time of 189 seconds at 171° C.

B. Preparation of Preimpregnated Substrate

Burlington Style 7628 glass cloth with an I-617 finish was impregnated with the varnish formulation of Example 2-A in a forced air vertical treater having a total length of 26 feet (7.9 meters) with the first 19.5 feet (5.9 meters) heated to 350° F. at a rate of 12 feet per min. (61 mm/sec.). The resin contained in the impregnated glass cloth had a 136 second gel time at 171° C. The resultant impregnated cloth had a resin content of 39% by weight.

C. Preparation of Laminate

Both unclad (no copper) and one sided copper clad, 0.062" (1.57 mm) thick laminates were pressed from aforementioned prepreg. Eight 12"×12" (304.8 cm×304.8 cm) plies were pressed into laminate form. The copper foil was a 1-ounce zinc oxide treated material. The laminates were pressed in a preheated Wabash press at 350° F. (176.7° C.) and 500 psi (34.47 kPa) for 1 hour (3600 s).

The unclad laminate had the following properties:
1. Tg=185° C.
2. Dynamic decomposition temperature was 380° C. (run at 3° C./min., 0.05° C./sec.).
3. Decomposition stability at 290° C. over a 60 min. (3600 s) period was 100% stable (no weight loss).
4. The relative blister resistance was determined by placing 3 (2"×4") unclad laminate coupons in a pressure pot at 15 psi steam pressure.
5. Tg=220° C. after 1 hour post cure at 225° C. for 2 hours (7200 s). After 2 hours (7200 s), the coupons were removed, externally dried and dipped in molten solder at 500° F. for 20 seconds. Each side of the 3 coupons was then inspected for any delamination blisters. The results were reported as no. of sides with no blisters divided by total no. of sides. This system had a perfect 6/6 or 100% passed.

The clad laminate had a copper peel strength of 5.6 to 6.4 lbs./in. (1120.8 N/m).

COMPARATIVE EXPERIMENT C 5.140 g (0.0243 equiv.) of Epoxy Resin D was blended with 6.615 g (0.0243 equiv.) of Dihydric Phenol B and 0.100 g of a 10% solution of benzyldimethylamine (BDMA) at 175° C. until a complete solution occurred. The resulting homogeneous composition was cured at 175° C. for 2 hours and 230° C. for 90 minutes. Physical properties of the final clear casting is reported in Table II.

COMPARATIVE EXPERIMENT D 4.981 g (0.02798 equiv.) of Epoxy Resin C, 7.683 g (0.0282 equiv.) of Dihydric Phenol B and 0.100 g of BDMA were blended and cured as described in Comparative Experiment C. Physical properties of the final clear casting is reported in Table II.

EXAMPLE 3

5.838 g (0.0328 equiv.) of Epoxy Resin C, 9.221 g (0.0332 equiv.) of Dihydric Phenol A and 0.100 g of a 10% solution BDMA were blended and cured as described in Comparative Experiment C. Physical properties of the final clear casting is reported in Table II.

EXAMPLE 4

5.662 g (0.0278 equiv.) of Epoxy Resin G, 7.716 g (0.0278 equiv.) of Dihydric Phenol A and 0.108 g of a 10% solution BDMA in methanol were blended and cured as described in Comparative Experiment C. Physical properties of the final clear casting is reported in Table II.

EXAMPLE 5

4.618 g (0.02496 equiv.) of Epoxy Resin E, 6.958 g (0.0250 equiv.) of Dihydric Phenol A and 0.100 g of a 10% solution BDMA were blended and cured as described in Comparative Experiment C. Physical properties of the final clear casting is reported in Table II.

EXAMPLE 6

5.425 g (0.0235 equiv.) of Epoxy Resin F, 6.520 g (0.0235 equiv.) of Dihydric Phenol A and 0.100 g of a 10% solution BDMA were blended and cured as described in Comparative Experiment C. Physical properties of the final clear casting is reported in Table II.

TABLE II

| Example or Comp. Expt. | Tg(DSC)[1] | Tg (DMA)[2] | Tg (DMA)[3] | Elevated[4] Temperature Mechanical Strength |
|---|---|---|---|---|
| Ex. 3 | 157° C. | 168° C. | 157° C. | 165° C. |
| Ex. 4 | 208° C. | 221° C. | 207° C. | 217° C. |
| Ex. 5 | 209° C. | 219° C. | 200° C. | 210° C. |
| Ex. 6 | 214° C. | 232° C. | 216° C. | 220° C. |
| Comp. Expt. C | 159° C. | 170° C. | 160° C. | 170° C. |
| Comp. Expt. D | 141° C. | 153° C. | 140° C. | 147° C. |

[1]The glass transition is reported as the inflection value of the heat flow curve recorded during a dynamic scan at 10° C./minute on a Differential Scanning Calorimeter.

[2]The glass transition temperature is reported from the peak of the damping curve which is recorded from the resonance data on a dynamic mechanical spectrometer heating at a rate of 3° C./minute (0.05° C./s).

[3]The glass transition temperature is from the onset of the storage modulus curve which is recorded from a dynamic mechanical spectrometer heating at a rate of 3° C./minute (0.05° C./s).

[4]The value reported is the temperature at which 50% of the storage modulus is lost as recorded on a dynamic mechanical spectrometer heating at a rate of 3° C./minute (0.05° C./s).

We claim:

1. In a composition comprising (A) at least one of (1) at least one epoxy resin represented by the following formulas I, II, III, IV, V or VI

FORMULA I

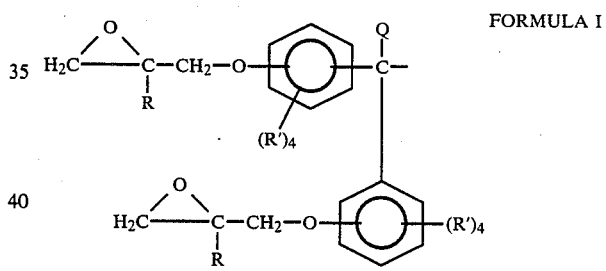

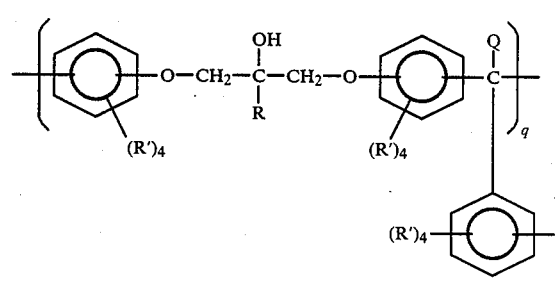

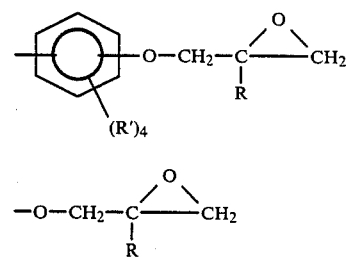

FORMULA II

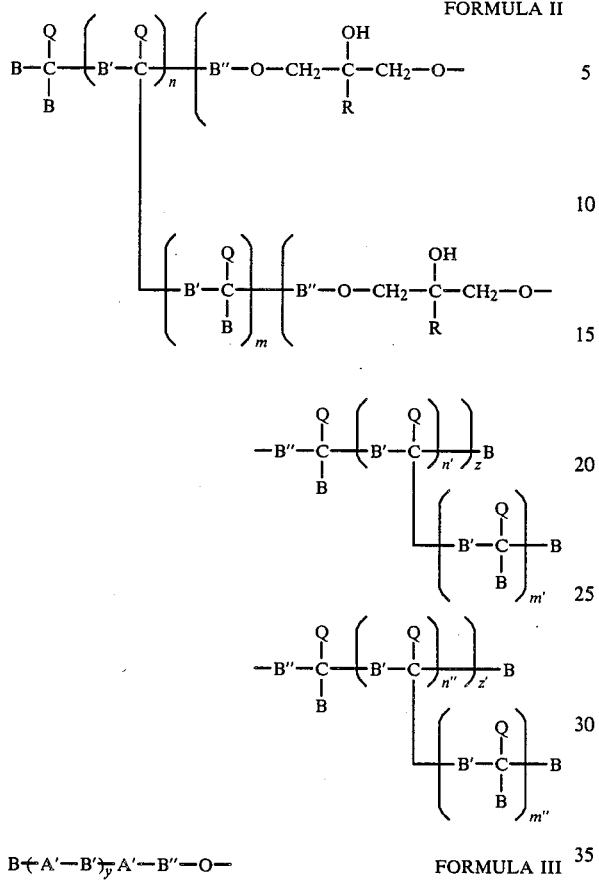

FORMULA III

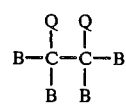

FORMULA IV

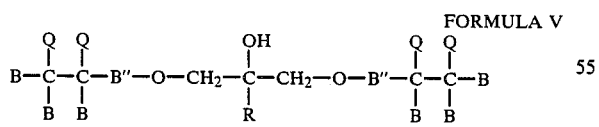

FORMULA V

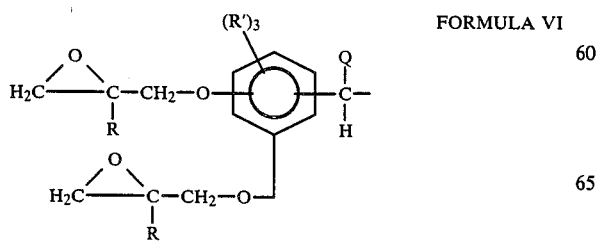

FORMULA VI

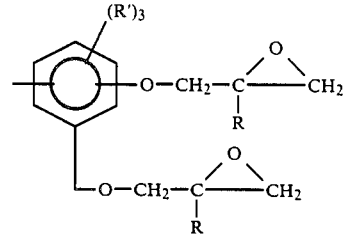

wherein each A' is independently a divalent hydrocarbyl group having from 1 to about 12 carbon atoms, —S—, —S—S—, —SO—, —SO$_2$—, —CO— or —O—; each B is represented by the formula

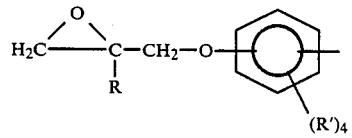

each B' is represented by the formula

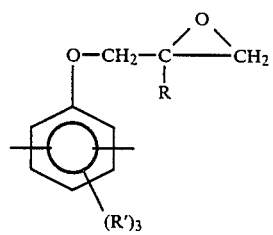

each B" is represented by the formula

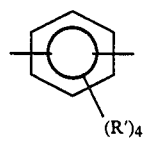

each R is independently hydrogen or an alkyl group having from 1 to about 4 carbon atoms; each Q is independently hydrogen or a hydrocarbyl group having from 1 to about 10 carbon atoms; each R' is independently hydrogen, a hydrocarbyl or hydrocarbyloxy group having from 1 to about 10 carbon atoms or a halogen; m has a value of n−1; m' has a value of n'−1; m" has a value of n"−1; each n, n' and n" independently has a value from zero to about 3; q has a value from zero to about 4; each y independently has an average value from 1 to about 5; y' has an average value of from zero to about 3 and each z and z' independently has a value from zero to about 3;

(2) the reaction product of
 (a) at least one epoxy resin as defined in component (A-1) and
 (b) at least one dihydric phenol represented by the following formulas VII, VIII or IX

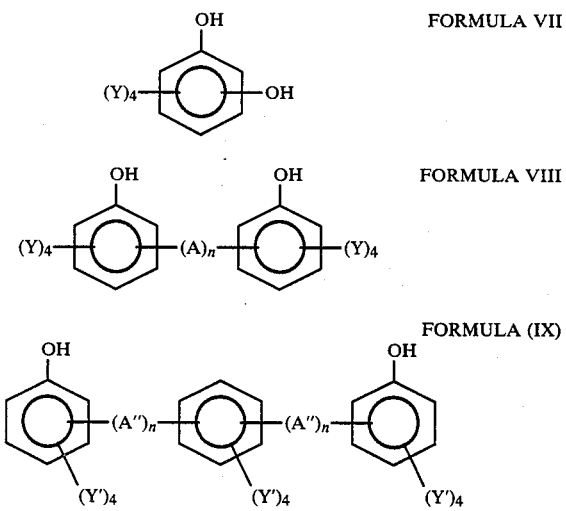

FORMULA VII

FORMULA VIII

FORMULA (IX)

wherein A is a divalent hydrocarbon group having from 1 to about 12 carbon atoms, —O—, —S—, —S—S—, —SO—, —SO$_2$—, or —CO—; each A" is independently a divalent hydrocarbon atom having from 1 to about 6 carbon atoms; each Y is independently hydrogen, a halogen or a hydrocarbyl or hydrocarbyloxy group having from 1 to about 10 carbon atoms; each Y' is independently hydrogen, a hydrocarbyl or hydrocarbyloxy group having from 1 to about 10, preferably from 1 to about 4 carbon atoms, a halogen atom or a hydroxyl group; each n has a value of 0 or 1; and wherein components (A-2-a) and (A-2-b) are present in quantities such that the ratio of phenolic hydroxyl groups to epoxide groups is from about 0.01:1 to about 0.5:1; or (3) mixtures thereof;

(B) at least one halogenated dihydric phenol represented by the following formulas X, XI or XII

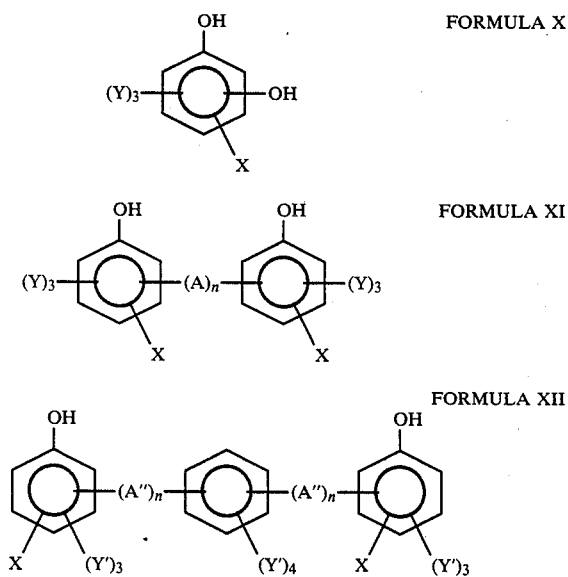

FORMULA X

FORMULA XI

FORMULA XII wherein A, Y, Y' and n are as defined above; each X is a halogen; and with the proviso that at least one X or Y in formula XI and at least one X or Y' in formula XII is a halogen wherein components (A) and (B) are present in quantities such that the ratio of phenolic hydroxyl groups to epoxide groups is from about 0.7:1 to about 1.1:1; the improvement which comprises employing as at least a portion of component (B) a halogenated dihydric phenol wherein at least about 5 weight percent of the halogen atoms present in component (B) are in the meta position with respect to the hydroxyl groups.

2. A composition of claim 1 wherein components (A) and (B) are present in quantities such that the ratio of phenolic hydroxyl groups to epoxide groups is from about 0.85:1 to about 1:1; at least 30 weight percent of the halogen atoms present in component (B) are in the meta position with respect to the hydroxyl groups and a stabilizing quantity of a stabilizer represented by the formula

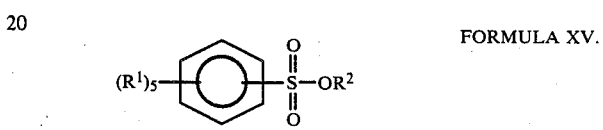

FORMULA XV.

wherein each R$^1$ is independently hydrogen, a hydrocarbyl group having from 1 to about 10 carbon atoms or a halogen, and R$^2$ is a hydrocarbyl group having from 1 to about 10 carbon atoms is present.

3. A composition of claim 2 wherein components (A) and (B) are present in quantities such that the ratio of phenolic hydroxyl groups to epoxide groups is from 0.9:1 to about 0.95:1; at least 50 weight percent of the halogen atoms present in component (B) are in the meta position with respect to the hydroxyl groups and said stabilizer is present in an amount of from about 0.001 to about 10 percent by weight of the weight of component (A).

4. A composition of claim 1 wherein component (A) is component (A-1) represented by formula I or II wherein Q, R and R' is hydrogen; q has an average value of from about 0.1 to about 2 and component (B) is represented by formula XI wherein A is a divalent hydrocarbyl group having from 1 to about 6 carbon atoms, each X is bromine.

5. A composition of claim 4 wherein in component (A-1) q has an average value of from about 0.5 to about 1.5; component (B) is 2,2',6,6'-tetrabromo-3,3',5,5'-tetramethyl-4,4'-biphenol or 2,2',6-tribromo-3,3',5,5'-tetramethyl-4,4'-biphenol or 4,4'-methylene-bis-3,5-dibromo-2,6-dimethylphenol, or mixture thereof and said stabilizer is methyl p-toluene sulfonate.

6. A composition of claim 2 wherein component (A) is component (A-1) represented by formula I or II wherein Q, R and R' is hydrogen; q has an average value of from about 0.1 to about 2 and component (B) is represented by formula XI wherein A is a divalent hydrocarbyl group having from 1 to about 6 carbon atoms and each X is bromine.

7. A composition of claim 6 wherein in component (A-1) q has an average value of from about 0.5 to about 1.5; component (B) is 2,2',6,6'-tetrabromo-3,3',5,5'-tetramethyl-4,4'-biphenol or 2,2',6-tribromo-3,3',5,5'-tetramethyl-4,4'-biphenol or 4,4'-methylene-bis-3,5-dibromo-2,6-dimethylphenol, or mixture thereof and said stabilizer is methyl p-toluene sulfonate.

8. A composition of claim 3 wherein component (A) is component (A-1) represented by formula I or II wherein Q, R and R' is hydrogen; m has an average value of from about 0.1 to about 2 and component (B) is represented by formula XI wherein A is a divalent hydrocarbyl group having from 1 to about 6 carbon atoms and each X is bromine.

9. A composition of claim 8 wherein in component (A-1) q has an average value of from about 0.5 to about 1.5; component (B) is 2,2',6,6'-tetrabromo-3,3',5,5'-tetramethyl-4,4'-biphenol or 2,2',6-tribromo-3,3',5,5'-tetramethyl-4,4'-biphenol or 4,4'-methylene-bis-3,5-dibromo-2,6-dimethylphenol, or mixture thereof and said stabilizer is methyl p-toluene sulfonate.

10. A composition of claim 1 wherein component (A) is component (A-1) represented by formula III wherein A' has from 1 to about 4 carbon atoms and each R and R' is hydrogen and component (B) is represented by formula XI wherein A is a divalent hydrocarbyl group having from 1 to about 6 carbon atoms and each X is bromine.

11. A composition of claim 10 wherein component (B) is 2,2',6,6'-tetrabromo-3,3',5,5'-tetramethyl--4,4'-biphenol or 2,2',6-tribromo-3,3',5,5'-tetramethyl-4,4'-biphenol or 4,4'-methylene-bis-3,5-dibromo-2,6-dimethylphenol, or mixture thereof and said stabilizer is methyl p-toluene sulfonate.

12. A composition of claim 2 wherein component (A) is component (A-1) represented by formula III wherein A' has from 1 to about 4 carbon atoms and each R and R' is hydrogen and component (B) is represented by formula XI wherein A is a divalent hydrocarbyl group having from 1 to about 6 carbon atoms and each X is bromine.

13. A composition of claim 12 wherein component (B) is 2,2',6,6'-tetrabromo-3,3',5,5'-tetramethyl-4,4'-biphenol or 2,2',6-tribromo-3,3',5,5'-tetramethyl-4,4'-biphenol or 4,4'-methylene-bis-3,5-dibromo-2,6-dimethylphenol, or mixture thereof and said stabilizer is methyl p-toluene sulfonate.

14. A composition of claim 3 wherein component (A) is component (A-1) represented by formula III wherein A' has from 1 to about 4 carbon atoms and each R and R' is hydrogen and component (B) is represented by formula XI wherein A is a divalent hydrocarbyl group having from 1 to about 6 carbon atoms and each X is bromine.

15. A composition of claim 14 wherein component (B) is 2,2',6,6'-tetrabromo-3,3',5,5'-tetramethyl-4,4'-biphenol or 2,2',6-tribromo-3,3',5,5'-tetramethyl-4,4'-biphenol or 4,4'-methylene-bis-3,5-dibromo-2,6-dimethylphenol, or mixture thereof and said stabilizer is methyl p-toluene sulfonate.

16. A composition of claim 1 wherein component (A) is component (A-1) represented by formulas IV or V wherein each Q, R and R' is hydrogen and component (B) is represented by formula XI wherein A is a divalent hydrocarbyl group having from 1 to about 6 carbon atoms and each X is bromine.

17. A composition of claim 16 wherein component (B) is 2,2',6,6'-tetrabromo-3,3',5,5'-tetramethyl-4,4'-biphenol or 2,2',6-tribromo-3,3',5,5'-tetramethyl-4,4'-biphenol or 4,4'-methylene-bis-3,5-dibromo-2,6-dimethylphenol, or mixture thereof and said stabilizer is methyl p-toluene sulfonate.

18. A composition of claim 2 wherein component (A) is component (A-1) represented by formulas IV or V wherein each Q, R and R' is hydrogen and component (B) is represented by formula XI wherein A is a divalent hydrocarbyl group having from 1 to about 6 carbon atoms and each X is bromine.

19. A composition of claim 18 wherein component (B) is 2,2',6,6'-tetrabromo-3,3',5,5'-tetramethyl-4,4'-biphenol or 2,2',6-tribromo-3,3',5,5'-tetramethyl-4,4'-biphenol or 4,4'-methylene-bis-3,5-dibromo-2,6-dimethylphenol, or mixture thereof and said stabilizer is methyl p-toluene sulfonate.

20. A composition of claim 3 wherein component (A) is component (A-1) represented by formulas IV or V wherein each Q, R and R' is hydrogen and component (B) is represented by formula XI wherein A is a divalent hydrocarbyl group having from 1 to about 6 carbon atoms and each X is bromine.

21. A composition of claim 20 wherein component (B) is 2,2',6,6'-tetrabromo-3,3',5,5'-tetramethyl-4,4'-biphenol or 2,2',6-tribromo-3,3',5,5'-tetramethyl-4,4'-biphenol or 4,4'-methylene-bis-3,5-dibromo-2,6-dimethylphenol, or mixture thereof and said stabilizer is methyl p-toluene sulfonate.

22. A composition of claim 1 wherein component (A) is component (A-1) represented by formula VI wherein each Q and R' is hydrogen and component (B) is represented by formula XI wherein A is a divalent hydrocarbyl group having from 1 to about 6 carbon atoms and each X is bromine.

23. A composition of claim 22 wherein component (B) is 2,2',6,6'-tetrabromo-3,3',5,5'-tetramethyl4,4'-biphenol or 2,2',6-tribromo-3,3',5,5,-tetramethyl-4,4'-biphenol or 4,4'-methylene-bis-3,5-dibrom-2,6-dimethylphenol, or mixture thereof and said stabilizer is methyl p-toluene sulfonate.

24. A composition of claim 2 wherein component (A) is component (A-1) represented by formula VI wherein each Q and R' is hydrogen and component (B) is represented by formula XI wherein A is a divalent hydrocarbyl group having from 1 to about 6 carbon atoms and each X is bromine.

25. A composition of claim 24 wherein component (B) is 2,2',6,6'-tetrabromo-3,3',5,5'-tetramethyl-4,4'-biphenol or 2,2',6-tribromo-3,3',5,5'-tetramethyl-4,4'-biphenol or 4,4'-methylene-bis-3,5-dibromo-2,6-dimethylphenol, or mixture thereof and said stabilizer is methyl p-toluene sulfonate.

26. A composition of claim 3 wherein component (A) is component (A-1) represented by formula VI wherein each Q and R' is hydrogen and component (B) is represented by formula XI wherein A is a divalent hydrocarbyl group having from 1 to about 6 carbon atoms and each X is bromine.

27. A composition of claim 26 wherein component (B) is 2,2',6,6'-tetrabromo-3,3',5,5'-tetramethyl-4,4'-biphenol or 2,2',6-tribromo-3,3',5,5'-tetramethyl-4,4'-biphenol or 4,4'-methylene-bis-3,5-dibromo-2,6-dimethylphenol, or mixture thereof and said stabilizer is methyl p-toluene sulfonate.

28. A composition which comprises (I) a composition of claims 1, 2, 3, 4, 5, 6, 7, 8, 9, 10, 11, 12, 13, 14, 15, 16, 17, 18, 19, 20, 21, 22, 23, 24, 25, 26 or 27 and (II) a catalytic quantity of at least one catalyst for effecting the reaction between components (I-A) and (I-B).

29. A composition of claim 28 wherein said catalyst is a phosphonium compound, an imidazole, a tertiary amine or a combination thereof.

30. A composition of claim 29 wherein said catalyst is ethyltriphenylphosphonium acetate.acetic acid complex, 2-methyl imidazole, 2-ethyl-4-methyl imidazole, benzyldimethyl amine or a combination thereof.

31. A substrate impregnated with a composition of claim 28 and an electrical or structural laminate or composite prepared from one or more layers of said impregnated substrate or a combination of said substrates.

32. An electrical laminate of claim 31 having at least one external layer of an electrically conductive material.

33. An electrical laminate of claim 32 wherein said electrically conductive material is copper.

34. A substrate impregnated with a composition of claim 29 and an electrical or structural laminate or composite prepared from one or more layers of said impregnated substrate or a combination of said substrates.

35. An electrical laminate of claim 34 having at least one external layer of an electrically conductive material.

36. An electrical laminate of claim 35 wherein said electrically conductive material is copper.

37. A substrate impregnated with a composition of claim 30 and an electrical or structural laminate or composite prepared from one or more layers of said impregnated substrate or a combination of said substrates.

38. An electrical laminate of claim 37 having at least one external layer of an electrically conductive material.

39. An electrical laminate of claim 38 wherein said electrically conductive material is copper.

* * * * *